United States Patent
Morgan et al.

(10) Patent No.: US 9,464,783 B2
(45) Date of Patent: Oct. 11, 2016

(54) CONCENTRATED PHOTOVOLTAIC PANEL

(71) Applicants: John Paul Morgan, Toronto (CA); Stefan Myrskog, Maple (CA); Brett Barnes, Toronto (CA); Michael Sinclair, Toronto (CA); Nigel Morris, Toronto (CA)

(72) Inventors: John Paul Morgan, Toronto (CA); Stefan Myrskog, Maple (CA); Brett Barnes, Toronto (CA); Michael Sinclair, Toronto (CA); Nigel Morris, Toronto (CA)

( * ) Notice: Subject to any disclaimer, the term of this patent is extended or adjusted under 35 U.S.C. 154(b) by 158 days.

(21) Appl. No.: 14/196,618

(22) Filed: Mar. 4, 2014

(65) Prior Publication Data

US 2014/0261625 A1 Sep. 18, 2014

Related U.S. Application Data

(60) Provisional application No. 61/798,205, filed on Mar. 15, 2013.

(51) Int. Cl.
*H01L 31/044* (2014.01)
*F21V 7/04* (2006.01)
(Continued)

(52) U.S. Cl.
CPC ............... *F21V 7/04* (2013.01); *B32B 37/12* (2013.01); *F21V 7/00* (2013.01); *F21V 13/04* (2013.01); *F21V 17/02* (2013.01); *F21V 29/004* (2013.01); *G01J 1/0414* (2013.01); *G01J 1/42* (2013.01); *G02B 6/0001* (2013.01); *H01L 31/02013* (2013.01); *H01L 31/048* (2013.01); *H01L 31/052* (2013.01); *H01L 31/0508* (2013.01); *H01L 31/0525* (2013.01);
(Continued)

(58) Field of Classification Search
CPC ....... H01L 31/00–31/078; Y02E 10/50–10/60
USPC ................................................. 136/243–265
See application file for complete search history.

(56) References Cited

U.S. PATENT DOCUMENTS 4,045,245 A   8/1977 Coleman et al.
4,131,485 A * 12/1978 Meinel ...................... F24J 2/18
                                                       126/685
(Continued)

FOREIGN PATENT DOCUMENTS

CN   201234560   2/2012
CN   202134560   2/2012
(Continued)

OTHER PUBLICATIONS

Unger, Blair L., "Dimpled Planar Lightguide Solar Concentrators", Ph.D. Dissertation, 2010, 137 pages, University of Rochester, Rochester, New York, U.S.A.
(Continued)

*Primary Examiner* — Bach Dinh

(57) ABSTRACT

A concentrated photovoltaic panel comprises at least one rigid sheet, one or more first optical elements disposed adjacent a first side of the at least one rigid sheet, one or more second optical elements disposed adjacent a second side of the at least one rigid sheet, and one or more photovoltaic elements. Each photovoltaic element is disposed between a respective first optical element and a respective second optical element. Each first optical element comprises at least one lens configured to focus light impinging thereon onto a corresponding reflecting surface of the respective second optical element. Each second optical element is configured to reflect light focused by the first optical element to the photovoltaic element disposed therebetween.

18 Claims, 14 Drawing Sheets

(51) Int. Cl.

| | |
|---|---|
| *H01L 31/052* | (2014.01) |
| *H01L 31/042* | (2014.01) |
| *F21V 13/04* | (2006.01) |
| *F21V 8/00* | (2006.01) |
| *H01L 31/054* | (2014.01) |
| *B32B 37/12* | (2006.01) |
| *F21V 7/00* | (2006.01) |
| *F21V 17/02* | (2006.01) |
| *F21V 29/00* | (2015.01) |
| *G01J 1/04* | (2006.01) |
| *G01J 1/42* | (2006.01) |
| *H01L 31/02* | (2006.01) |
| *H01L 31/048* | (2014.01) |
| *H01L 31/05* | (2014.01) |
| *H01L 31/0687* | (2012.01) |
| *H02S 40/22* | (2014.01) |

(52) U.S. Cl.
    CPC ....... *H01L 31/0543* (2014.12); *H01L 31/0547* (2014.12); *H01L 31/0687* (2013.01); *H02S 40/00* (2013.01); *H02S 40/22* (2014.12); *Y02E 10/52* (2013.01); *Y02E 10/544* (2013.01); *Y10T 29/49826* (2015.01)

(56) References Cited

U.S. PATENT DOCUMENTS

| | | | |
|---|---|---|---|
| 4,148,299 A | 4/1979 | Sherman, Jr. |
| 4,337,758 A | 7/1982 | Meinel et al. |
| 4,877,460 A | 10/1989 | Flodl |
| 4,962,450 A | 10/1990 | Reshetin |
| 4,975,814 A | 12/1990 | Schairer |
| 5,197,792 A | 3/1993 | Jiao et al. |
| 5,528,057 A | 6/1996 | Yanagase et al. |
| 5,791,757 A | 8/1998 | O'Neil et al. |
| 5,897,184 A | 4/1999 | Eichenlaub et al. |
| 5,914,760 A | 6/1999 | Daiku |
| 6,008,449 A | 12/1999 | Cole |
| 6,097,549 A | 8/2000 | Jenkins et al. |
| 6,130,730 A | 10/2000 | Jannson et al. |
| 6,307,145 B1 | 10/2001 | Kataoka et al. |
| 6,323,415 B1 | 11/2001 | Uematsu et al. |
| 6,578,989 B2 | 6/2003 | Osumi et al. |
| 6,667,782 B1 | 12/2003 | Taira et al. |
| 6,811,277 B2 | 11/2004 | Amano |
| 6,951,415 B2 | 10/2005 | Amano et al. |
| 6,987,613 B2 | 1/2006 | Pocius et al. |
| 7,021,805 B2 | 4/2006 | Amano et al. |
| 7,072,096 B2 | 7/2006 | Holman et al. |
| 7,083,313 B2 | 8/2006 | Smith |
| 7,152,985 B2 | 12/2006 | Benitez et al. |
| 7,160,010 B1 | 1/2007 | Chinniah et al. |
| 7,290,906 B2 | 11/2007 | Suzuki et al. |
| 7,316,496 B2 | 1/2008 | Wu et al. |
| 7,371,001 B2 | 5/2008 | Miyashita |
| 7,391,939 B1 | 6/2008 | Williams |
| 7,431,481 B2 | 10/2008 | Stefanov |
| 7,467,879 B2 | 12/2008 | Herloski et al. |
| 7,530,721 B2 | 5/2009 | Mi et al. |
| 7,626,761 B2 | 12/2009 | Haga et al. |
| 7,664,350 B2 | 2/2010 | Ghosh et al. |
| 7,672,549 B2 | 3/2010 | Ghosh et al. |
| 7,697,219 B2 | 4/2010 | DiDomenico |
| 7,740,392 B2 | 6/2010 | Itoh et al. |
| 7,794,100 B2 | 9/2010 | Ito |
| 7,806,547 B2 | 10/2010 | Benitez et al. |
| 7,817,885 B1 | 10/2010 | Moore et al. |
| 7,855,335 B2 | 12/2010 | Maeda |
| 7,855,763 B2 | 12/2010 | Yuuki et al. |
| 7,873,257 B2 | 1/2011 | Morgan |
| 7,925,129 B2 | 4/2011 | Ghosh et al. |
| 7,946,286 B2 | 5/2011 | Raymond et al. |
| 7,991,257 B1 | 8/2011 | Coleman |
| 7,991,261 B2 | 8/2011 | Morgan |
| 8,030,569 B2 | 10/2011 | Nakata |
| 8,066,408 B2 | 11/2011 | Rinko |
| 8,067,688 B2 | 11/2011 | Gronet |
| 8,152,339 B2 | 4/2012 | Morgan |
| 8,189,970 B2 | 5/2012 | Moore et al. |
| 8,189,973 B2 | 5/2012 | Travis et al. |
| 8,279,164 B2 | 10/2012 | Daiku |
| 8,328,403 B1 | 12/2012 | Morgan et al. |
| 8,412,010 B2 | 4/2013 | Ghosh et al. |
| 8,506,148 B2 | 8/2013 | Shimizu |
| 8,586,860 B2 | 11/2013 | Nakata |
| 8,609,455 B2 | 12/2013 | Krasnov et al. |
| 8,749,898 B2 | 6/2014 | Minano et al. |
| 8,885,995 B2 | 11/2014 | Morgan |
| 8,899,815 B2 | 12/2014 | Chen et al. |
| 8,917,447 B2 | 12/2014 | Wolk et al. |
| 9,029,681 B1 | 5/2015 | Nielson |
| 2002/0011263 A1 | 1/2002 | Muramoto |
| 2002/0017900 A1 | 2/2002 | Takeda |
| 2002/0024808 A1 | 2/2002 | Suehiro et al. |
| 2003/0047207 A1 | 3/2003 | Aylaian |
| 2005/0030960 A1 | 2/2005 | Sumida et al. |
| 2005/0146897 A1 | 7/2005 | Mimura et al. |
| 2005/0212397 A1 | 9/2005 | Murazaki et al. |
| 2005/0265029 A1 | 12/2005 | Epstein et al. |
| 2006/0060867 A1 | 3/2006 | Suehiro |
| 2006/0272698 A1 | 12/2006 | Durvasula |
| 2007/0002566 A1 | 1/2007 | Wu et al. |
| 2007/0002583 A1 | 1/2007 | Lee et al. |
| 2007/0175509 A1 | 8/2007 | Yagiura et al. |
| 2007/0181901 A1 | 8/2007 | Loh |
| 2007/0189017 A1 | 8/2007 | Hofmann |
| 2007/0217202 A1 | 9/2007 | Sato |
| 2007/0236927 A1 | 10/2007 | Liu |
| 2007/0251568 A1* | 11/2007 | Maeda ............... G02B 19/0042 136/246 |
| 2007/0256724 A1 | 11/2007 | Fork et al. |
| 2007/0256725 A1* | 11/2007 | Fork ..................... F24J 2/18 136/246 |
| 2007/0256726 A1 | 11/2007 | Fork et al. |
| 2007/0279910 A1 | 12/2007 | Lin |
| 2008/0087321 A1 | 4/2008 | Schwartzman |
| 2008/0149168 A1 | 6/2008 | Flaherty et al. |
| 2008/0316761 A1 | 12/2008 | Minano et al. |
| 2009/0002997 A1 | 1/2009 | Koester |
| 2009/0064993 A1 | 3/2009 | Ghosh et al. |
| 2009/0067784 A1 | 3/2009 | Ghosh et al. |
| 2009/0071467 A1 | 3/2009 | Benitez et al. |
| 2009/0126792 A1 | 5/2009 | Gruhlke et al. |
| 2009/0165842 A1 | 7/2009 | McDonald et al. |
| 2009/0188546 A1 | 7/2009 | McGlynn et al. |
| 2009/0196069 A1 | 8/2009 | Iwasaki |
| 2009/0213607 A1 | 8/2009 | Tatsukawa |
| 2009/0223555 A1 | 9/2009 | Ammar |
| 2009/0250099 A1 | 10/2009 | Pan |
| 2009/0256999 A1 | 10/2009 | Ogasawara et al. |
| 2009/0277498 A1 | 11/2009 | Angel |
| 2010/0002169 A1 | 1/2010 | Kuramitsu et al. |
| 2010/0012169 A1 | 1/2010 | Jensen et al. |
| 2010/0024868 A1 | 2/2010 | Baruchi et al. |
| 2010/0037954 A1 | 2/2010 | Thony |
| 2010/0043864 A1 | 2/2010 | Young et al. |
| 2010/0051102 A1 | 3/2010 | Lin |
| 2010/0059108 A1 | 3/2010 | McDonald et al. |
| 2010/0103349 A1 | 4/2010 | Schmidt et al. |
| 2010/0108124 A1 | 5/2010 | Knox et al. |
| 2010/0110720 A1 | 5/2010 | Cennini et al. |
| 2010/0116319 A1 | 5/2010 | Martinez Anton et al. |
| 2010/0116336 A1 | 5/2010 | Martinez Anton et al. |
| 2010/0126554 A1 | 5/2010 | Morgan et al. |
| 2010/0165495 A1 | 7/2010 | Murtha |
| 2010/0170556 A1 | 7/2010 | Frolov et al. |
| 2010/0186798 A1* | 7/2010 | Tormen ............... H01L 31/0547 136/246 |
| 2010/0224232 A1 | 9/2010 | Cummings et al. |
| 2010/0278480 A1 | 11/2010 | Vasylyev |
| 2010/0307565 A1 | 12/2010 | Suga |
| 2011/0011449 A1 | 1/2011 | Morgan et al. |

(56) References Cited

U.S. PATENT DOCUMENTS

| | | |
|---|---|---|
| 2011/0044000 A1 | 2/2011 | Minano et al. |
| 2011/0096426 A1 | 4/2011 | Ghosh et al. |
| 2011/0120539 A1 | 5/2011 | Minano et al. |
| 2011/0121984 A1 | 5/2011 | Schripsema |
| 2011/0132426 A1 | 6/2011 | Kang et al. |
| 2011/0132432 A1 | 6/2011 | Schultz et al. |
| 2011/0155210 A1 | 6/2011 | Kim et al. |
| 2011/0155221 A1 | 6/2011 | Yu et al. |
| 2011/0162713 A1 | 7/2011 | Morgan et al. |
| 2011/0170036 A1 | 7/2011 | Ishikawa et al. |
| 2011/0203662 A1 | 8/2011 | Minano et al. |
| 2011/0214738 A1 | 9/2011 | Halahmi et al. |
| 2011/0292655 A1 | 12/2011 | Ing et al. |
| 2012/0055552 A1 | 3/2012 | Morgan et al. |
| 2012/0092772 A1 | 4/2012 | Salomon |
| 2012/0099325 A1 | 4/2012 | Ghosh et al. |
| 2012/0112557 A1 | 5/2012 | Sager |
| 2012/0127573 A1 | 5/2012 | Robinson et al. |
| 2012/0145221 A1 | 6/2012 | Ozaki et al. |
| 2012/0145222 A1 | 6/2012 | Chen |
| 2012/0152331 A1 | 6/2012 | Luo |
| 2012/0160300 A1 | 6/2012 | Munro |
| 2012/0167949 A1 | 7/2012 | Dentinger et al. |
| 2012/0222724 A1 | 9/2012 | Nakata |
| 2012/0247537 A1 | 10/2012 | Mei |
| 2012/0255594 A1 | 10/2012 | Bishnoi et al. |
| 2012/0287671 A1 | 11/2012 | Parker et al. |
| 2012/0298181 A1 | 11/2012 | Cashion et al. |
| 2012/0298182 A1 | 11/2012 | Hwang |
| 2012/0312356 A1 | 12/2012 | Mizuo et al. |
| 2012/0318319 A1 | 12/2012 | Pinarbasi et al. |
| 2013/0104984 A1 | 5/2013 | Myrskog |
| 2013/0118559 A1 | 5/2013 | Castillo et al. |
| 2013/0233384 A1 | 9/2013 | Morgan et al. |
| 2013/0247960 A1 | 9/2013 | Morgan |
| 2013/0249293 A1 | 9/2013 | Yang et al. |
| 2013/0276866 A1 | 10/2013 | Maeda |
| 2013/0284237 A1 | 10/2013 | Lin et al. |
| 2013/0298901 A1 | 11/2013 | Ruiz et al. |

FOREIGN PATENT DOCUMENTS

| | | |
|---|---|---|
| DE | 102006028932 | 12/2007 |
| EP | 02-277033 | 11/1990 |
| EP | 1715260 | 10/2006 |
| EP | 1895228 | 3/2008 |
| EP | 2061092 | 5/2009 |
| EP | 2068378 A2 | 6/2009 |
| EP | 2105682 | 9/2009 |
| EP | 2492966 | 8/2012 |
| GB | 2468410 A | 9/2010 |
| JP | 55158681 | 12/1980 |
| JP | 02277033 | 11/1990 |
| JP | 03-253833 | 11/1991 |
| JP | 03253833 | 12/1991 |
| JP | 06-160638 | 6/1994 |
| JP | 06160638 | 7/1994 |
| JP | 10-12024 | 1/1998 |
| JP | 10012024 | 1/1998 |
| JP | 11271749 | 10/1999 |
| JP | 2006114239 | 4/2006 |
| JP | 2006318807 | 11/2006 |
| JP | 2007012416 A | 1/2007 |
| JP | 2007033803 | 2/2007 |
| JP | 2010101912 | 5/2010 |
| JP | 2013080832 | 5/2013 |
| KR | 2011044502 | 4/2011 |
| WO | 03056876 | 7/2003 |
| WO | WO2009/002281 | 12/2008 |
| WO | 2009063416 | 5/2009 |
| WO | WO2010033632 | 3/2010 |
| WO | WO2010033859 | 3/2010 |
| WO | WO2010124028 | 10/2010 |
| WO | WO2011011885 | 2/2011 |
| WO | WO2011022631 | 2/2011 |
| WO | WO2011120148 | 10/2011 |
| WO | WO2012014088 | 2/2012 |
| WO | 2012075384 | 6/2012 |
| WO | WO2012085461 | 6/2012 |
| WO | WO2013010313 | 1/2013 |
| WO | WO2014005102 | 1/2014 |

OTHER PUBLICATIONS

Victoria, M. et al., "Optical Characterization of FluidReflex Concentrator", 6th International Conference on Concentrating Photovoltaic Systems, Apr. 9, 2010, 13 pages, American Institute of Physics, U.S.A.

Hallas, Justin M., et al., "Lateral Translation Micro-Tracking of Planar Micro-Optic Solar Concentrator", Proc. of SPIE vol. 7769, 2010, pp. 776904-1 to 776904-7, U.S.A.

Solfocus, webpage content, "Concentrated Photovoltaics, Solfocus", Feb. 13, 2013, 3 pages, Australia.

Winston, Roland, "Thermodynamically efficient NonImaging Optics", Dan David Symposium, University of California Merced, Sep. 26, 2008, U.S.A.

Winston, Roland, et al., "Planar Concentrators Near the étendue Limit", Optics Letters, Oct. 1, 2005, vol. 30, No. 19, pp. 2617-2619, U.S.A.

Karp, Jason, et al. "Planar Micro-Optic Solar Concentration Using Multiple Imaging Lenses into a Common Slab Waveguide", SPIE Optics and Photonics, 22 pages, Aug. 4, 2009, San Diego, U.S.A.

Sakurada et al., "Simulation of Temperature Characteristics of InGaP/InGaAs/Ge Triple-Junction Solar Cell under Concentrated Light", Japanese Journal of Applied Physics 50 (2011), Apr. 20, 2011, pp. 04DP13-1 to 04DP13-4, Japan.

Steiner, Marc, et al., "Increasing the Energy Yield of CPV Modules through Optimized Solar Cell Interconnection", AIP Conference Proceedings 1407 (2011), pp. 404-408, U.S.A.

* cited by examiner

CONCENTRATED PHOTOVOLTAIC PANEL

CROSS-REFERENCE TO RELATED APPLICATION

This application claims the benefit of U.S. Application No. 61/798,205 filed on Mar. 15, 2013, the content of which is incorporated herein by reference in its entirety.

FIELD OF THE INVENTION

The present invention relates generally to photovoltaic cells, and in particular to a concentrated photovoltaic panel.

BACKGROUND OF THE INVENTION

In the field of solar energy, conventional photovoltaic panels have traditionally been used to generate electricity from sunlight. Conventional photovoltaic panels consist of arrays of photovoltaic cells, with each cell consisting of a semiconductor (e.g. monocrystalline silicon or polycrystalline silicon) substrate. The power output from such conventional photovoltaic panels is a direct function of the total substrate area of the array. As a result, sizeable arrays of large, expensive semiconductor substrates are typically needed to generate sufficient electrical output.

Concentrated photovoltaic panels have been more recently developed, and generally reduce the need for large semiconductor substrates by concentrating light beams (i.e. sun rays) using optical elements, such as parabolic reflectors or focusing lenses. The optical elements create a more intense beam of solar energy that is directed onto a much smaller photovoltaic cell.

Concentrated photovoltaic panels have been previously described. For example, German Patent Application No. 102006028932 to Doerr describes a module having a photovoltaic element designed to pass through a portion of light focused by a convergent lens. The module has a reflector that is spaced from photovoltaic elements disposed on a glass substrate. An active layer of the photovoltaic elements has a thickness of about 5 to about 60 microns.

U.S. Patent Application Publication No. 2012/0145221 to Ozaki et al. describes a concentrator photovoltaic collector and apparatus in which light collecting efficiency is insignificantly reduced and sealing ability is insignificantly deteriorated while using a resin lens and a metal case. After attaching a homogenizer and a photovoltaic element, and a holding member, a Fresnel lens is attached to a case to close an opening at an upper end portion of the case. The holding member is then attached to the case to close an opening at a lower end portion thereof, so as to form a concentrator photovoltaic collector in which the photovoltaic element is accommodated.

U.S. Patent Application Publication No. 2012/0298182 to Hwang describes a flexible solar cell including a flexible substrate; a first electrode on the flexible substrate; a second electrode on the flexible substrate, the second electrode being spaced apart from the first electrode; a photoelectric conversion element, one side of the photoelectric conversion element being connected to the first electrode and another side of the photoelectric conversion element being connected to the second electrode; and a reflective layer between the flexible substrate and the photoelectric conversion element. The reflective layer includes at least one recessed portion, and is configured to reflect incident light toward the photoelectric conversion element.

U.S. Patent Application Publication No. 2013/0276866 to Maeda describes a linear concentrating solar collector that includes two trough-type reflectors having respective curved reflective surfaces that define respective focal lines, and that are connected along a common edge in a decentered arrangement such that the focal lines are parallel and spaced-apart, and such that solar radiation reflected by the curved reflective surfaces is concentrated and overlaps in a defocused state. A solar cell is disposed in the overlap region to receive all of the reflected radiation from the curved reflective surfaces in a defocused state. An optional solid optical structure is used to support and position the trough-type reflectors and solar cell, and to facilitate self-forming of the curved reflective surfaces.

Improvements are generally desired. It is therefore an object at least to provide a novel concentrated photovoltaic panel.

SUMMARY OF THE INVENTION

In one aspect, there is provided a concentrated photovoltaic panel comprising: at least one rigid sheet; one or more first optical elements disposed adjacent a first side of the at least one rigid sheet; one or more second optical elements disposed adjacent a second side of the at least one rigid sheet; and one or more photovoltaic elements, each photovoltaic element disposed between a respective first optical element and a respective second optical element, each first optical element comprising at least one lens configured to focus light impinging thereon onto a corresponding reflecting surface of the respective second optical element, each second optical element being configured to reflect light focused by the first optical element to the photovoltaic element.

The at least one lens may be configured to focus direct light impinging thereon onto the corresponding reflecting surface of the respective second optical element.

The at least one lens may comprise a generally ring-shaped, plano-convex lens arranged concentrically about a central axis of the first optical element. The lens may comprise a convex surface defined as a surface of full revolution around the central axis. The convex surface may be spaced radially from the central axis. The lens may comprise a planar surface that is co-planar with a planar back surface of the first optical element. The planar back surface may be oriented towards and generally parallel with the at least one rigid sheet. The at least one lens may comprise a plurality of generally ring-shaped, plano-convex lenses arranged concentrically about the central axis.

The at least one reflecting surface may comprise an annular reflecting surface arranged concentrically about a central axis of the second optical element. The annular reflecting surface may be defined as a surface of revolution around the central axis. Each second optical element may further comprise an inner reflecting surface configured to reflect light reflected by the annular reflecting surface to the photovoltaic element. The inner annular reflecting surface may be defined as a surface of revolution around the central axis. The at least one reflecting surface may be configured to reflect light by total internal reflection. Each second optical element may be positioned such that the central axis is generally collinear with a central axis of the respective first optical element. Each photovoltaic element may be positioned on the collinear central axes.

The panel may further comprise a compliant layer disposed between the first optical element and the at least one rigid sheet. The compliant layer may comprise an elastomeric material. The panel of may further comprise a compliant layer disposed between the second optical element and the at least one rigid sheet. The compliant layer may comprise an elastomeric material.

The at least one rigid sheet may comprise a first rigid sheet spaced from and parallel with a second rigid sheet, the one or more photovoltaic elements being disposed between the first and second rigid sheets. The panel may further comprise an intermediate layer disposed between the first and second rigid sheets.

The panel may further comprise structure configured to conduct heat away from the photovoltaic element. The structure may be a conductor grid providing an electrical connection to the photovoltaic element. The structure may comprise a plurality of strips extending outwardly from the photovoltaic element. The strips may extend radially outwardly from the photovoltaic element. The structure may further comprise a first arc and a second arc attached to the strips.

BRIEF DESCRIPTION OF THE DRAWINGS

Embodiments will now be described more fully with reference to the accompanying drawings in which.

DETAILED DESCRIPTION OF THE EMBODIMENTS

Figure 1:
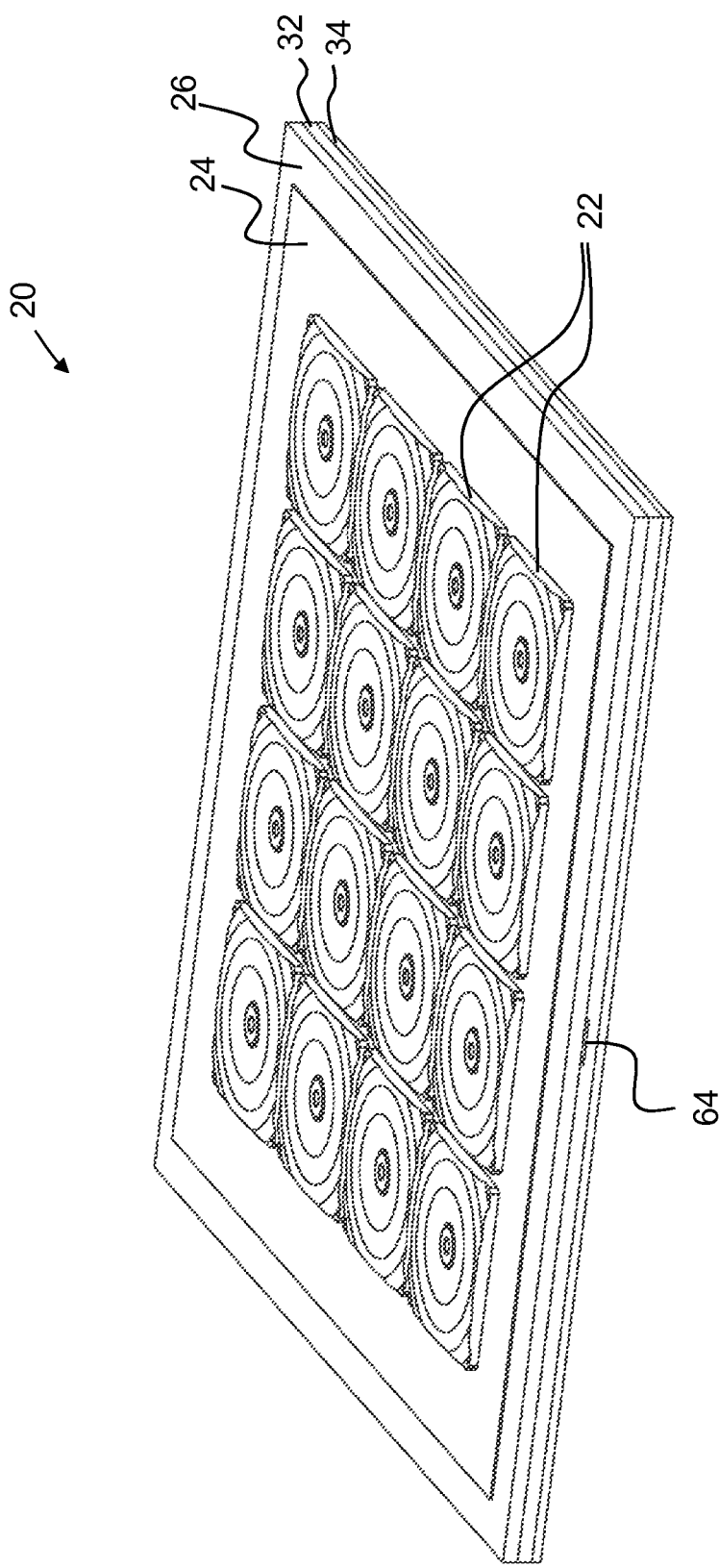
FIG. 1 is a perspective view of a concentrated photovoltaic panel.
Figure 2:
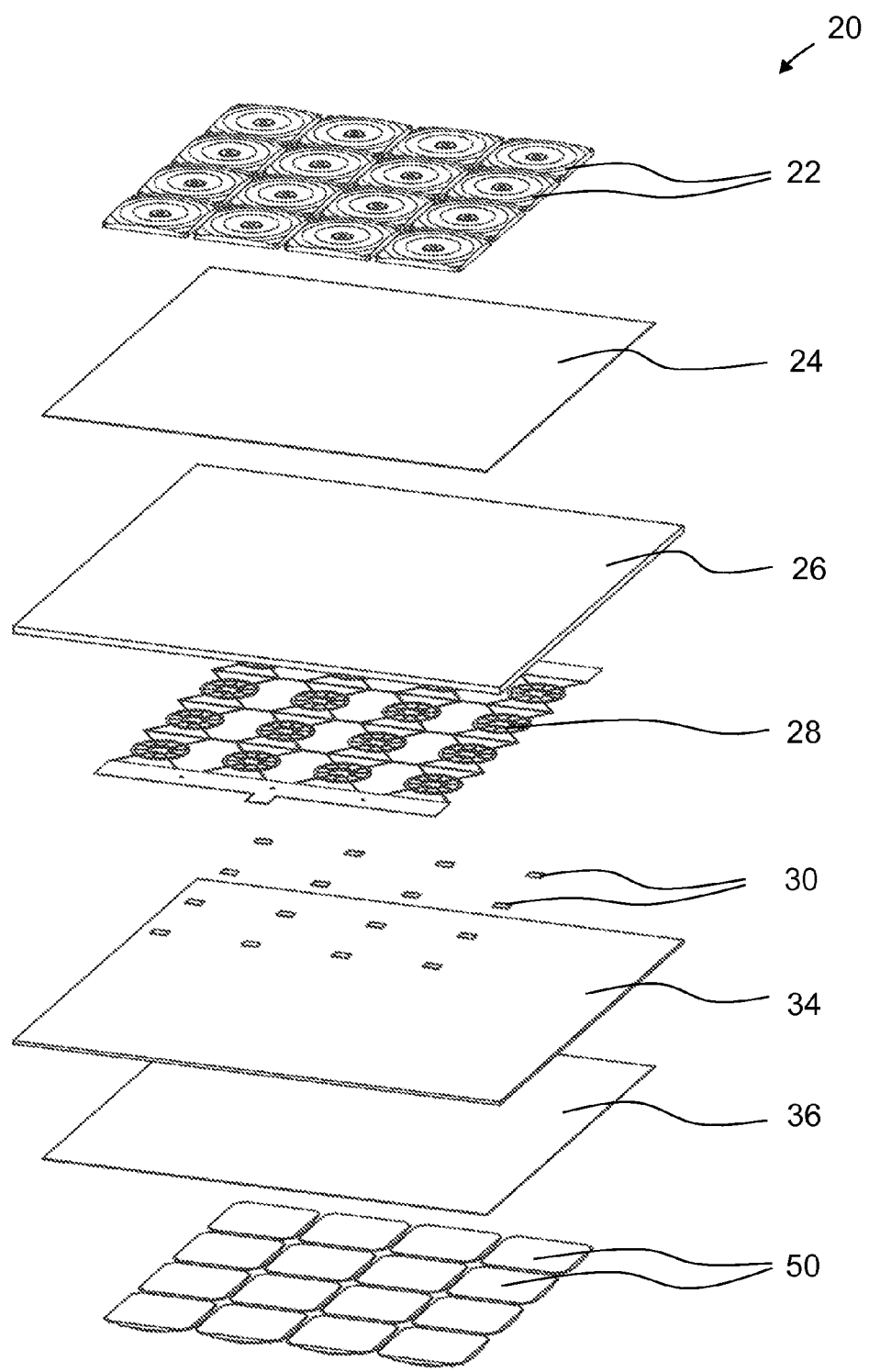
FIG. 2 is an exploded view of a portion of the concentrated photovoltaic panel of FIG. 1.
Figure 3A:
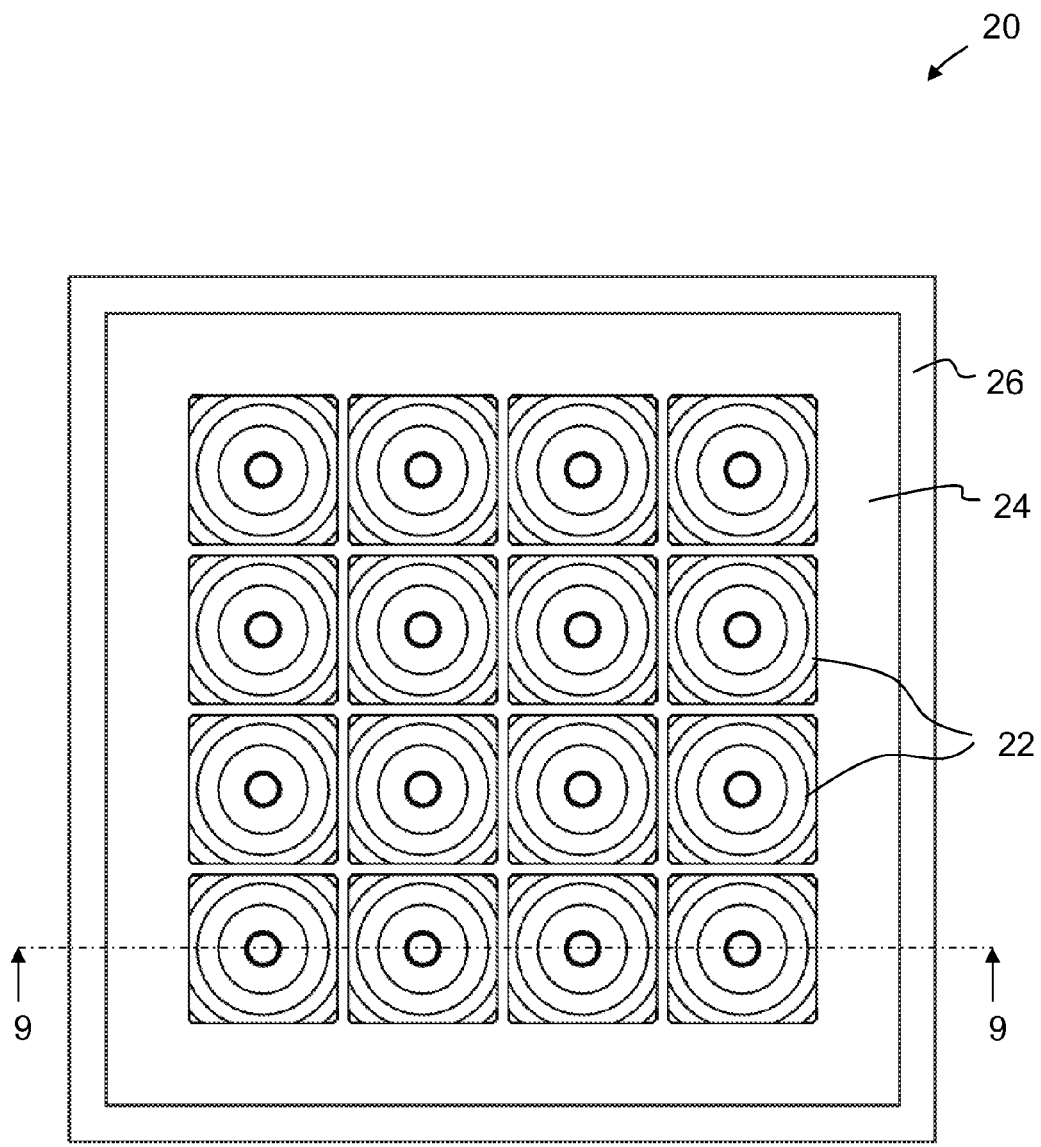
FIGS. 3A and 3B are top plan and bottom plan views, respectively, of the concentrated photovoltaic panel of FIG. 1.
Figure 3B:
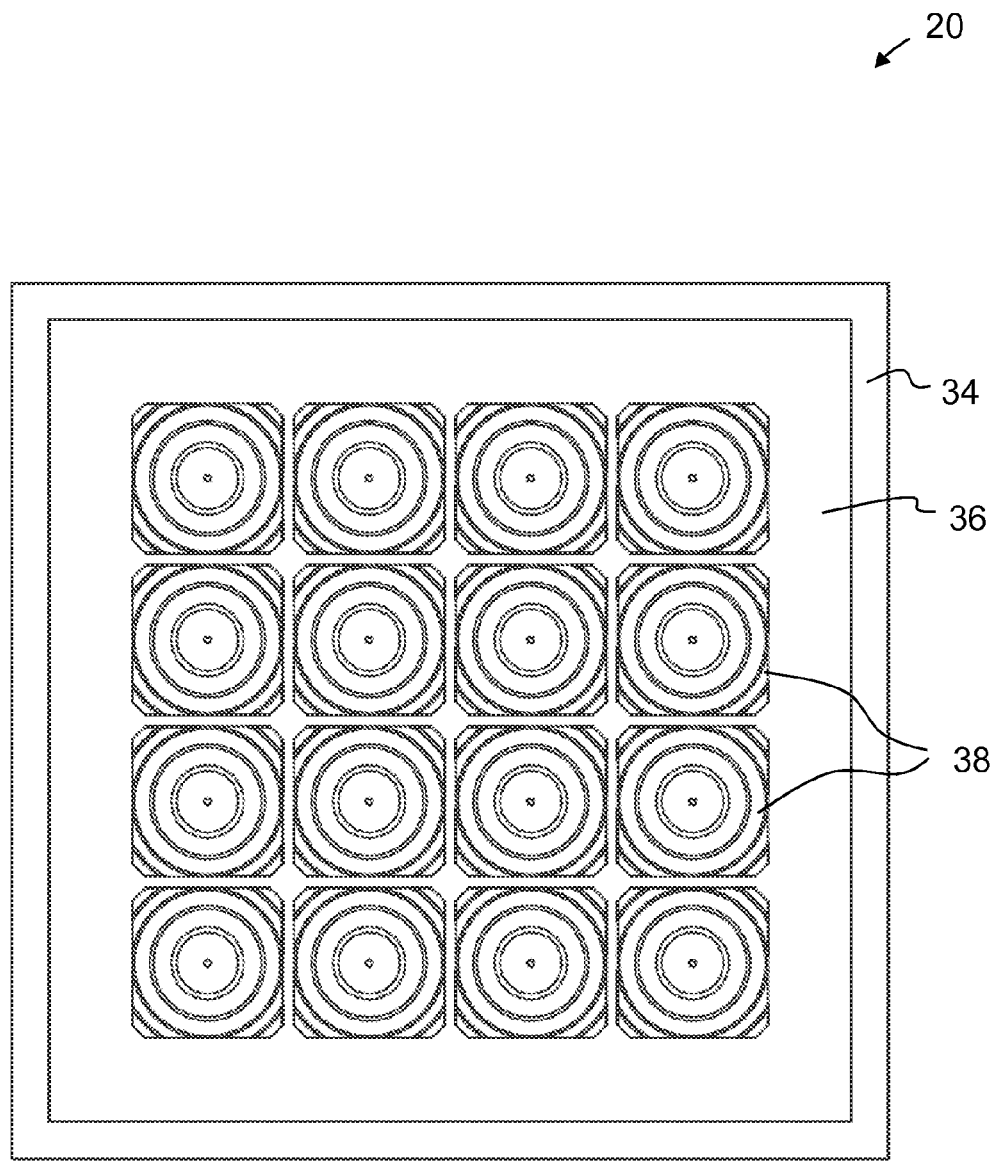
Figure 4:
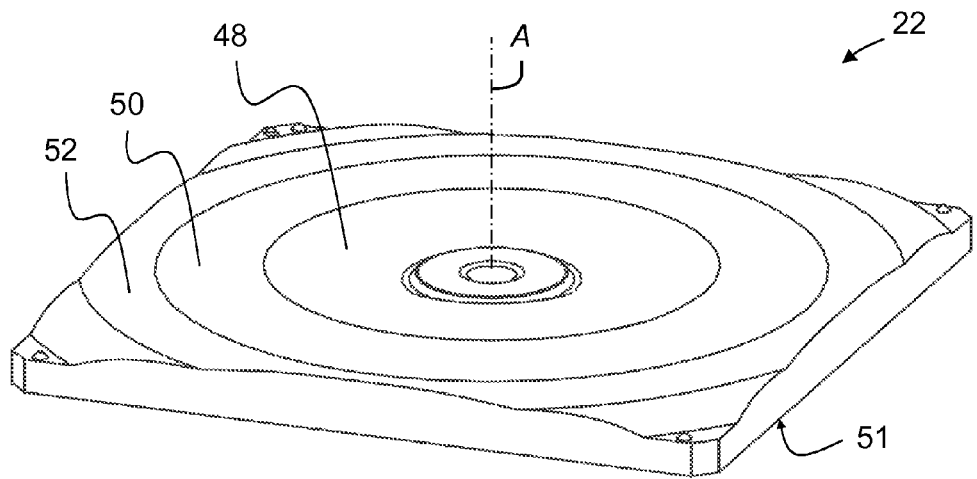
FIG. 4 is a perspective view of a first optical element forming part of the concentrated photovoltaic panel of FIG. 1.
Figure 5:
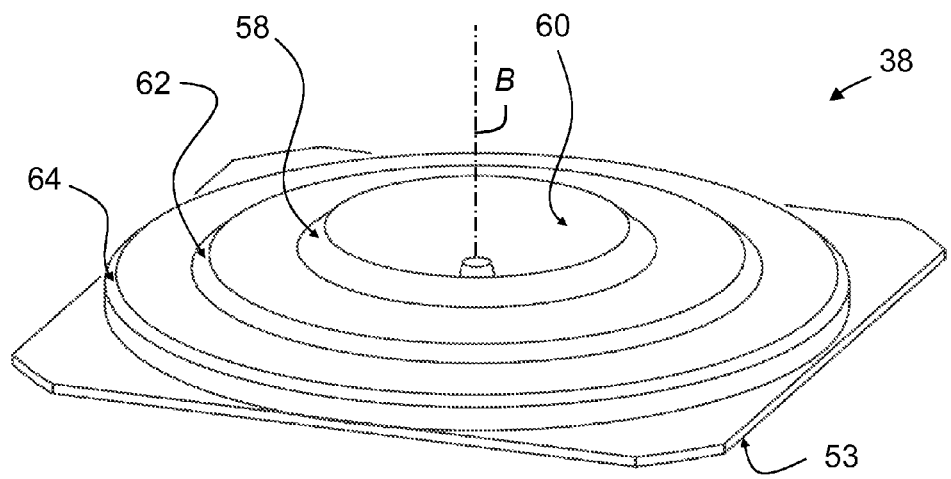
FIG. 5 is a perspective view of a second optical element forming part of the concentrated photovoltaic panel of FIG. 1.
Figure 6:
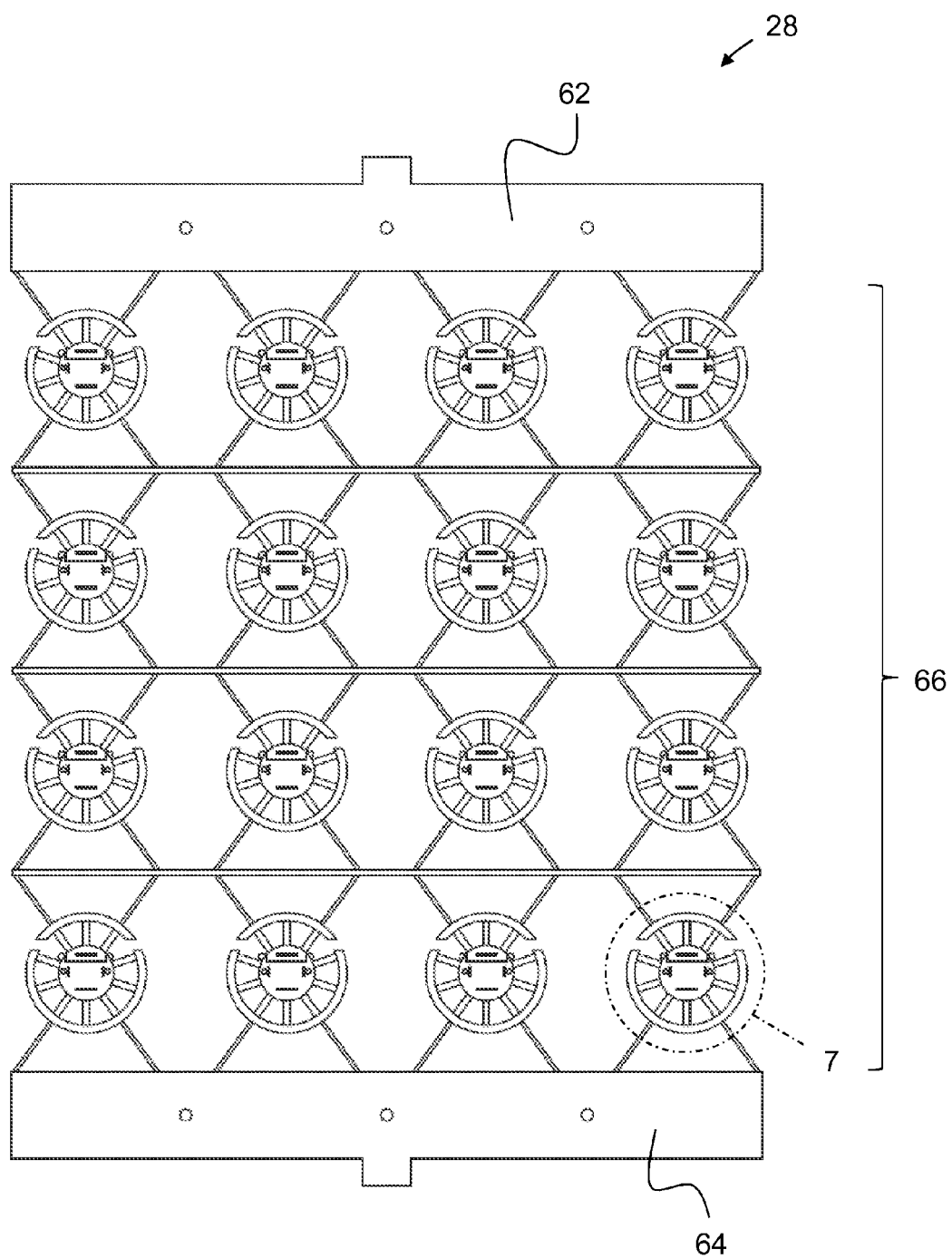
FIG. 6 is a top plan view of a conductor grid forming part of the concentrated photovoltaic panel of FIG. 1.
Figure 7:
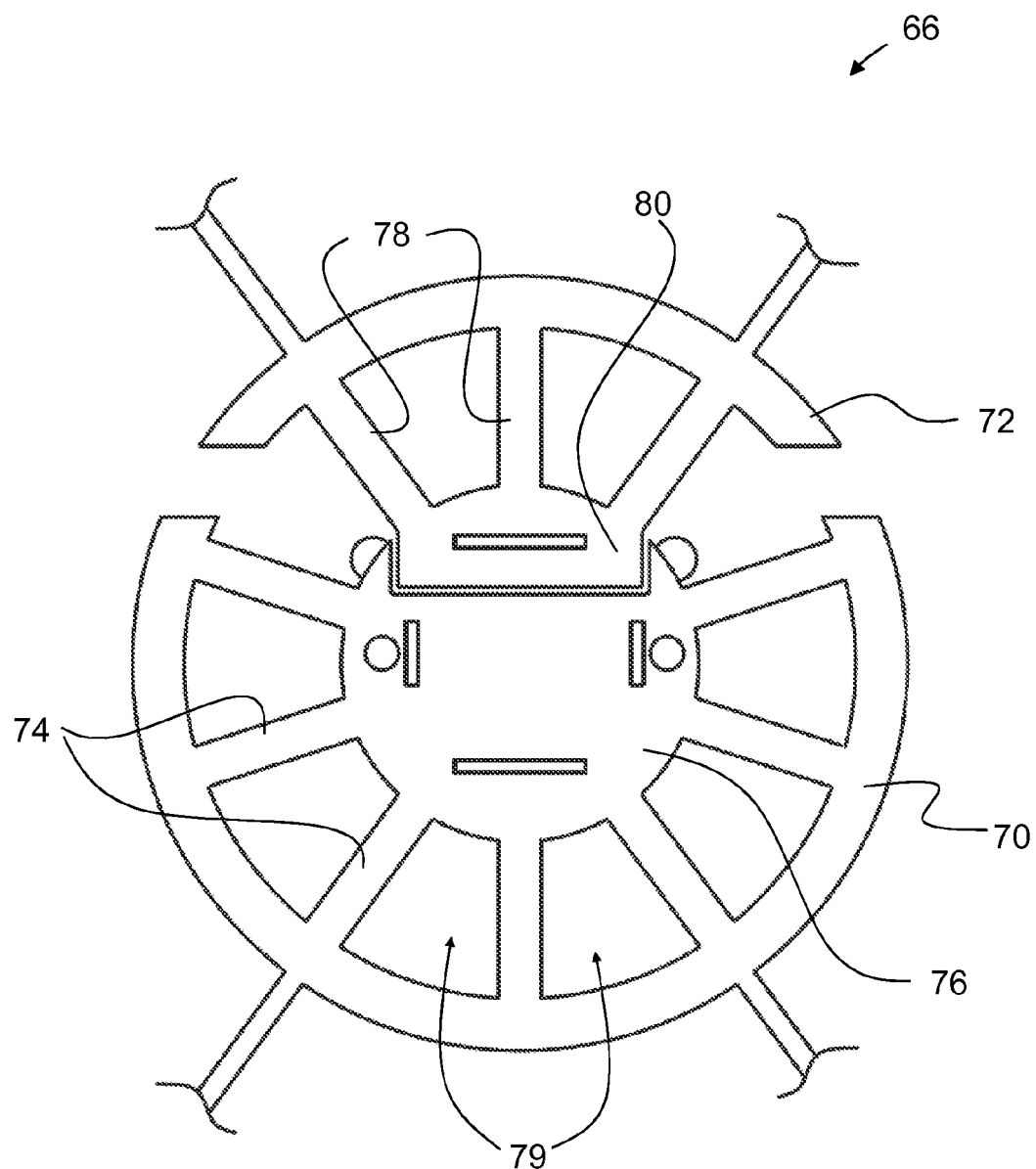
FIG. 7 is an enlarged fragmentary view of a portion of the conductor grid of FIG. 6 identified by reference numeral 7.
Figure 8:
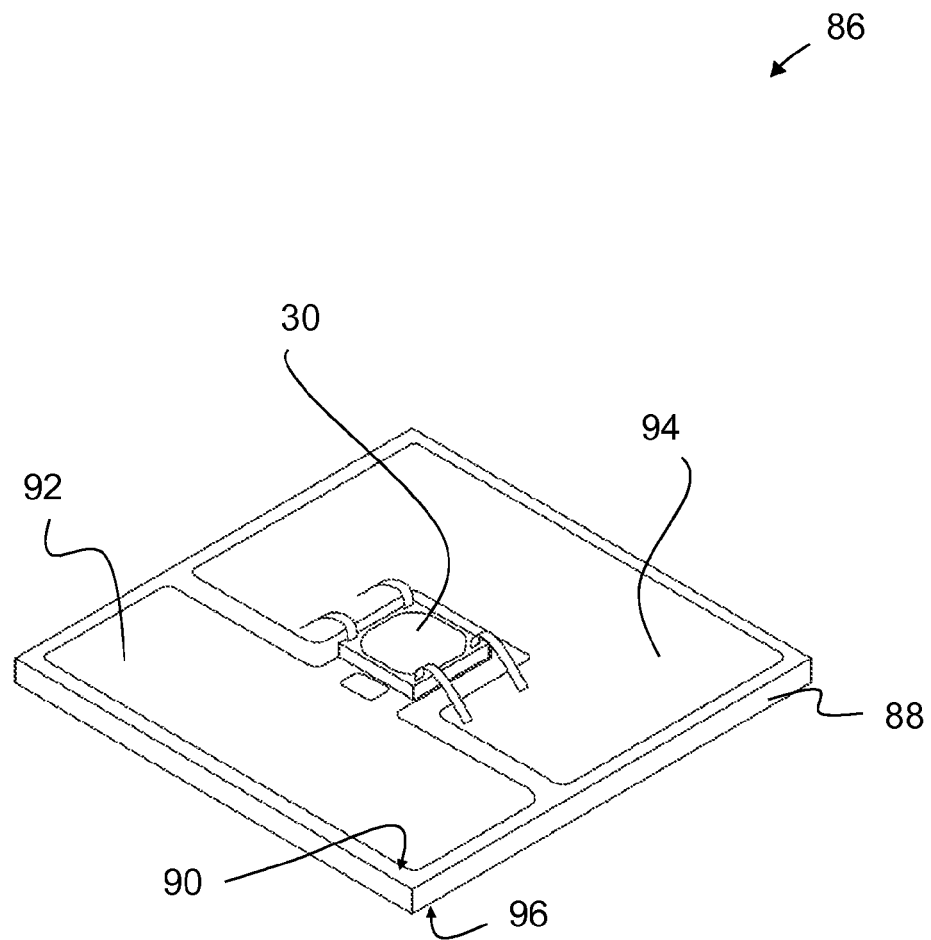
FIG. 8 is a perspective view of a receiver forming part of the concentrated photovoltaic panel of FIG. 1.
Figure 9:
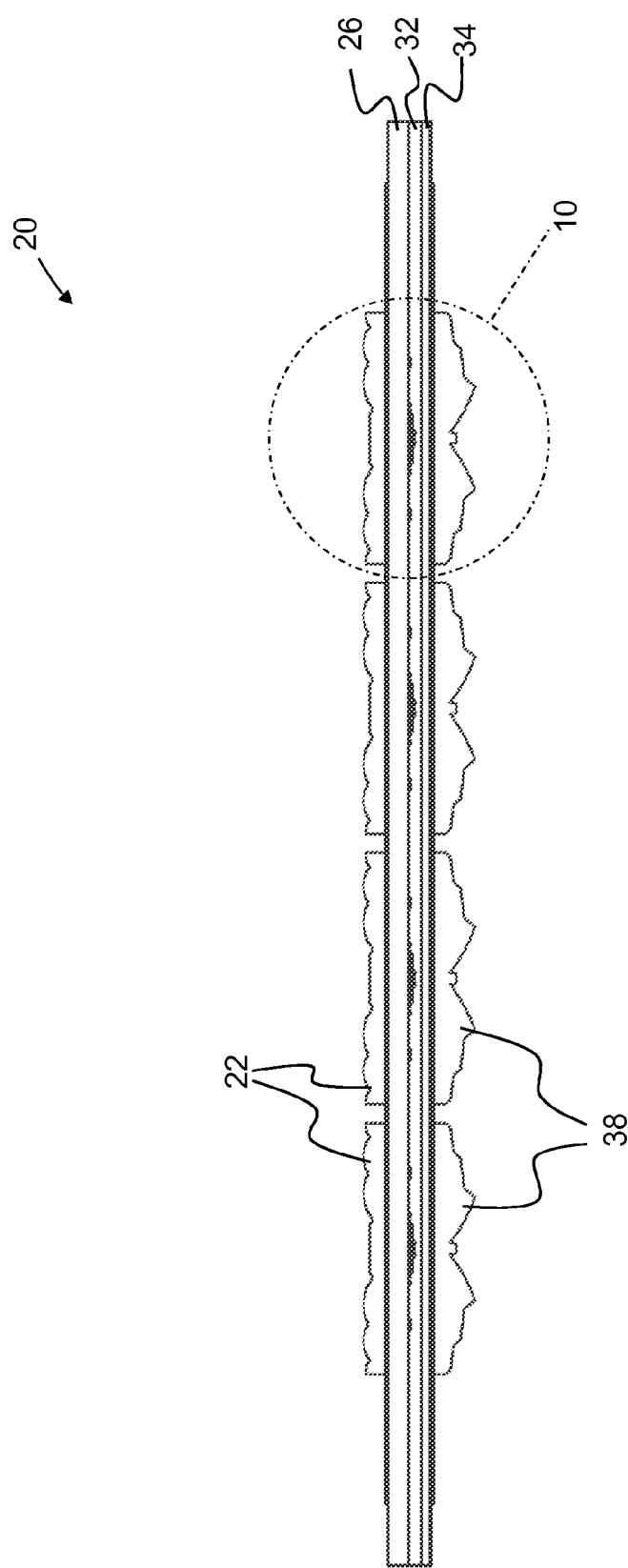
FIG. 9 is a sectional side view of the concentrated photovoltaic panel of FIG. 3A, taken along the indicated section line.
Figure 10:
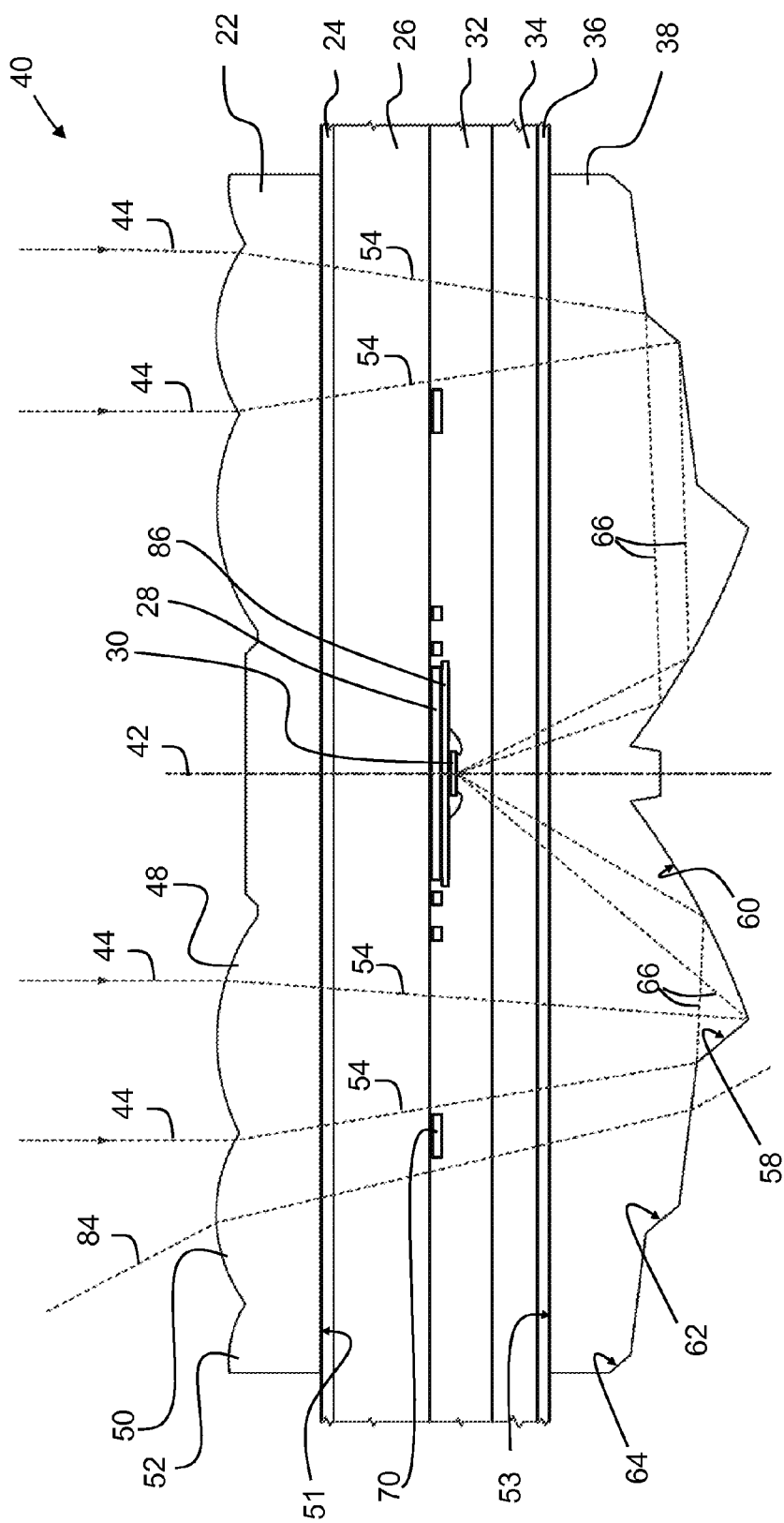
FIG. 10 is an enlarged fragmentary view of a portion of the concentrated photovoltaic panel of FIG. 9 identified by reference numeral 10, showing light rays.

Turning now to FIGS. 1 to 10, a concentrated photovoltaic panel is shown and is generally indicated by reference numeral 20. The panel 20 comprises one or more first optical elements 22, an elastomeric first compliant layer 24, a first rigid sheet 26, a conductor grid 28, one or more photovoltaic elements 30, an intermediate layer 32 (not shown in FIG. 2), a second rigid sheet 34, an elastomeric second compliant layer 36, and one or more second optical elements 38, all of which are arranged in a generally stacked manner. The components of the panel 20 are configured as one or more concentrated photovoltaic collectors 40, each of which is configured to collect and concentrate direct light, and in particular direct sunlight, for generating electricity by the photovoltaic effect. Each collector 40 comprises a respective first optical element 22, a respective second optical element 38, and a respective photovoltaic element 30 disposed generally therebetween. In the embodiment shown, the panel 20 comprises sixteen (16) concentrated photovoltaic collectors 40 arranged in a four-by-four (4×4) array.

Each first optical element 22 is fabricated of a light-transmissive material, and is shaped so as to comprise a plurality of generally ring-shaped lenses that are arranged in a concentric manner about a central axis A. Each lens has an optical axis (not shown) that is parallel with the central axis A, and each lens is configured to focus direct light 44 impinging thereon onto a corresponding reflecting surface of a respective second optical element 38. Here, it will be understood that direct light refers to light impinging on the first optical element 22 that is generally parallel with the optical axis of the lens, and therefore generally parallel with the central axis A of the first optical element 22. Reciprocally, it will be understood that indirect light refers to light that is non-parallel with the optical axis of the lens, and therefore non-parallel with the central axis A of the first optical element 22. The first optical element 22 has a planar back surface 51 that is perpendicular to the central axis A.

In this embodiment, each first optical element 22 comprises three (3) lenses, namely a first lens 48, a second lens 50 and a third lens 52. Each of the lenses 48, 50 and 52 is a generally ring-shaped, plano-convex lens and has a convex surface defined as a surface of full revolution around the central axis A, and a planar surface that is co-planar with the planar back surface 51. As may be seen, the convex surface of each of the lenses 48, 50 and 52 is spaced from the central axis A along the radial direction. Additionally, and as may be seen, the lenses 48 and 50 each have a convex surface defined as a surface of full revolution around the central axis A, while the lens 52 has a convex surface defined as a surface of full revolution around the central axis A, and which is truncated tangentially to the direction of revolution. In this embodiment, each first optical element 22 is fabricated of polymethyl methacrylate (PMMA).

Each first optical element 22 is disposed on the first compliant layer 24 disposed on the first rigid sheet 26, such that the planar back surface 51 is oriented towards and is generally parallel with the first rigid sheet 26. The first compliant layer 24 and the first rigid sheet 26 are each fabricated of a light-transmissive material, and in this embodiment, the first compliant layer 24 is a silicone layer and the first rigid sheet 26 is a glass plate.

The first rigid sheet 26 and the second rigid sheet 34 are spaced from each other in a parallel relationship. The intermediate layer 32 is disposed between the first rigid sheet 26 and the second rigid sheet 34, and generally encapsulates the conductor grid 28 and the one or more photovoltaic elements 30. An elastomeric, second compliant layer 36 is disposed on the second rigid sheet 34. The second rigid sheet 34, the intermediate layer 32 and the second compliant layer 36 are each fabricated of a light-transmissive material, and in this embodiment, the second rigid sheet 34 is a glass plate, and each of the intermediate layer 32 and the second compliant layer 36 is a layer of silicone.

In this embodiment, the first compliant layer 24 serves as an adhesive to bond the first optical elements 22 to the first rigid sheet 26, and the second compliant layer 36 serves as an adhesive to bond the second optical elements 38 to the second rigid sheet 34. As a result of their elastomeric nature, each of the compliant layers 24 and 36 effectively provides a buffer that allows differences in thermal expansion between the optical element and the rigid sheet to be accommodated while maintaining the mechanical integrity of the panel 20 and while generally maintaining optical alignment of the components thereof. As will be understood, silicone can accommodate an elastic elongation of about 500% without mechanical failure, which in this embodiment effectively permits each of the compliant layers 24 and 36 to expand by up to about 500%, as necessary, while maintaining the mechanical bonds at the interfaces between the optical elements and the rigid sheets. Additionally, each of the compliant layers 24 and 36 facilitates the emission of thermal energy from the first and second rigid sheets 26 and 34, and therefore facilitates the dissipation of heat from the panel 20.

Each second optical element 38 is disposed on the second compliant layer 36 disposed on the second rigid sheet 34, such that its planar back surface 53 is oriented towards and is generally parallel with the second rigid sheet 34. Each second optical element 38 is fabricated of a light-transmissive material, and in this embodiment the second optical element 38 is fabricated of PMMA. The second optical element 38 is shaped so as to comprise a plurality of annular reflecting surfaces that are arranged in a concentric manner about a central axis B. Each second optical element 38 is positioned relative to a corresponding first optical element 22 within the collector 40, such that its central axis B is generally collinear with the central axis A of the first optical element 22, and so as to define a central axis 42 of the collector 40. The annular reflecting surfaces are configured to reflect direct light focused by the first optical element 22 to the photovoltaic element 30. The planar back surface 53 of the second optical element 38 is perpendicular to the central axis B.

In this embodiment, each second optical element 38 comprises four (4) annular reflecting surfaces each defined as a surface of revolution around the central axis 55. The four (4) annular reflecting surfaces comprise a first reflecting surface 58 configured to reflect direct light 54 focused by the first lens 48 to an inner reflecting surface 60, a second reflecting surface 62 configured to reflect direct light 54 focused by the second lens 50 to the inner reflecting surface 60, and a third reflecting surface 64 configured to reflect direct light 54 focused by the third lens 52 to the inner reflecting surface 60. The inner reflecting surface 60 is configured to reflect direct light 66 reflected by the first, second and third reflecting surfaces 58, 62 and 64 to the photovoltaic element 30. As will be understood, the first, second and third reflecting surfaces 58, 62 and 64, and the inner reflecting surface 60, are configured to reflect direct light focused by the first optical element 22 by total internal reflection (TIR). As may be seen, each of the four (4) reflecting surfaces 58, 60, 62 and 64 is defined as a surface of full revolution around the central axis B, and is radially spaced from the central axis B.

The conductor grid 28 is fabricated of an electrically and thermally conductive material, and is electrically connected to the photovoltaic elements 30. The conductor grid 28 is positioned within the panel 20 such that each photovoltaic element 30 is generally centered at the normal axis 42 of a respective collector 40. The conductor grid 28 is disposed against the first rigid sheet 26 and is otherwise generally encapsulated by the intermediate layer 32, and in this embodiment the conductor grid 28 comprises a pattern of stamped copper foil that is bonded to the first rigid sheet 26 by an adhesive layer (not shown). The conductor grid 28 comprises a positive bus bar 62, a negative bus bar 64, and further comprises a plurality of interconnection traces 66 connecting the photovoltaic elements 30, either directly or indirectly, to the bus bars 62 and 64.

Surrounding each photovoltaic element 30 within the conductor grid 28 is a positive arc 70 and a negative arc 72. Connected to the positive arc 70 is a first plurality of radial strips 74, which in turn is connected to a positive terminal 76 that is connected, either directly or indirectly, to the photovoltaic element 30. Similarly, connected to the negative arc 72 is a second plurality of radial strips 78, which in turn is connected to a negative terminal 80 that is connected, either directly or indirectly, to the photovoltaic element 30. As will be understood, the positive and negative arcs 70 and 72, the strips 74 and 78, and the positive and negative terminals 76 and 80 electrically connect each photovoltaic element 30 to the bus bars 62 and 64, and also conduct heat away from the photovoltaic element 30 so as to maintain the photovoltaic element 30 at a suitable temperature for efficient operation. As will be understood, gaps 79 between the radial strips 74 and 78, the positive and negative arcs 70 and 72, and the positive and negative terminals 76 and 80 facilitate heat dissipation from the conductor grid 28 to surrounding portions of the panel 20, and also provide windows through which light may pass, including direct light 54 focused by the first optical element 22 onto the second optical element 36, and indirect light. In this manner, the radial strips 74 and 78, the positive and negative arcs 70 and 72, and the positive and negative terminals 76 and 80 surrounding each photovoltaic element 30 effectively serve as a "heat spreader" for the photovoltaic element 30.

In this embodiment, the panel 20 comprises one or more receivers 86, with each receiver 86 supporting and electrically connecting a photovoltaic element 30 to the conductor grid 28. Each receiver 86 comprises a frame 88 configured to hold the photovoltaic element 30 and to dissipate heat therefrom. On a front side 90 of the frame 88 is a positive terminal 92 and a negative terminal 94, each of which is electrically connected to a respective positive terminal (not shown) and negative terminal (not shown) of the photovoltaic element 30. In this embodiment, the outwardly-facing surface of the photovoltaic element 30 is negative, and is electrically connected to the negative terminal 94. On a back side 96 of the frame 88 is a positive contact (not shown) and a negative contact (not shown), each contact being respectively connected to the positive terminal 90 and the negative terminal 92, and each contact being configured to be electrically connected to a respective one of the positive and negative terminals 76 and 80 of the conductor grid 28. In this embodiment, the receiver 86 is constructed by placing the photovoltaic element 30 on the frame 88, and then wire bonding the photovoltaic element 30 to metal leads. The receiver 86 may be bonded to the positive and negative terminals 76 and 80 of the conductor grid 28 from the back side 96 of the frame 88 by soldering or by means of an electrically conductive adhesive, and/or the receiver 86 may include crimping features (not shown) configured to engage slots within the positive and negative terminals 76 and 80.

Each photovoltaic element 30 is a high-efficiency photovoltaic cell that is configured to convert light absorbed therein into an electrical current by the photovoltaic effect. In this embodiment, each photovoltaic element 30 is a GaInP/GaInAs/Ge triple-junction photovoltaic cell.

In use, and within each collector 40 of the panel 20, direct light 44 impinging on the first lens 48 is focused through the first compliant layer 24, the first rigid sheet 26, the intermediate layer 32, the second rigid sheet 34, and the second compliant layer 36, onto the first reflecting surface 58, and is in turn reflected to the photovoltaic element 30 via reflection by the inner reflecting surface 60. Similarly, direct light 44 impinging on the second lens 50 and the third lens 52 is focused onto the second reflecting surface 62 and the third reflecting surface 64, respectively, and is in turn reflected to the photovoltaic element 30 via reflection by the inner reflecting surface 60. The photovoltaic element 30 absorbs light impinging thereon and generates an electrical current. The electrical current generated by the photovoltaic elements 30 is drawn from the panel 20 through the conductor grid 28 via the positive and negative bus bars 62 and 64.

Indirect light 84 impinging on the first optical element 22 is generally transmitted through the collector 40, and therefore through the panel 20, without being focused onto any of the annular reflecting surfaces 58, 62 or 64 and reflected to the photovoltaic element 30.

As will be appreciated, the collector 40 is generally transparent to indirect light, and has a generally sturdy construction. These features advantageously allow the panel 20 to be used as an exterior element of a building, such as for example as a window, a skylight, and the like, for allowing indirect light from the exterior of the building to illuminate the interior of the building. The building may, for example, be a residential building, a commercial building, a greenhouse, and the like.

As will be appreciated, the configuration of the radial strips 74 and 78 within the collector 40 allows thermal energy to be conducted from the photovoltaic element 30 more effectively, as compared to conventional concentrated photovoltaic cells that rely on an air gap between optical elements and the photovoltaic element for heat dissipation. Additionally, the first and second compliant layers 40 and 46 further allow thermal energy to be conducted from the collector 40 more effectively, as they allow heat to be transferred from one material to another more effectively as compared to prior art concentrated photovoltaic panels that comprise air gaps between their optical layers.

As will be appreciated, the arrangement of radial strips 74 within the conductor grid 28 provide paths for conduction of thermal energy from, and for conduction of electrical current to and from, the photovoltaic element 30, while advantageously reducing the amount of non-transparent material used within the collector 40 for improving the transparency of the panel 20 to both direct and indirect light.

As will be appreciated, components of the panel 20, with the exception of the photovoltaic element 30, are fabricated of materials that are generally inexpensive. Additionally, the efficiency of the collector 40 permits the size of the photovoltaic element 30 to be reduced. As a result, the panel 20 may advantageously be manufactured at a relatively low cost, as compared to conventional concentrated photovoltaic panels.

Figure 11:
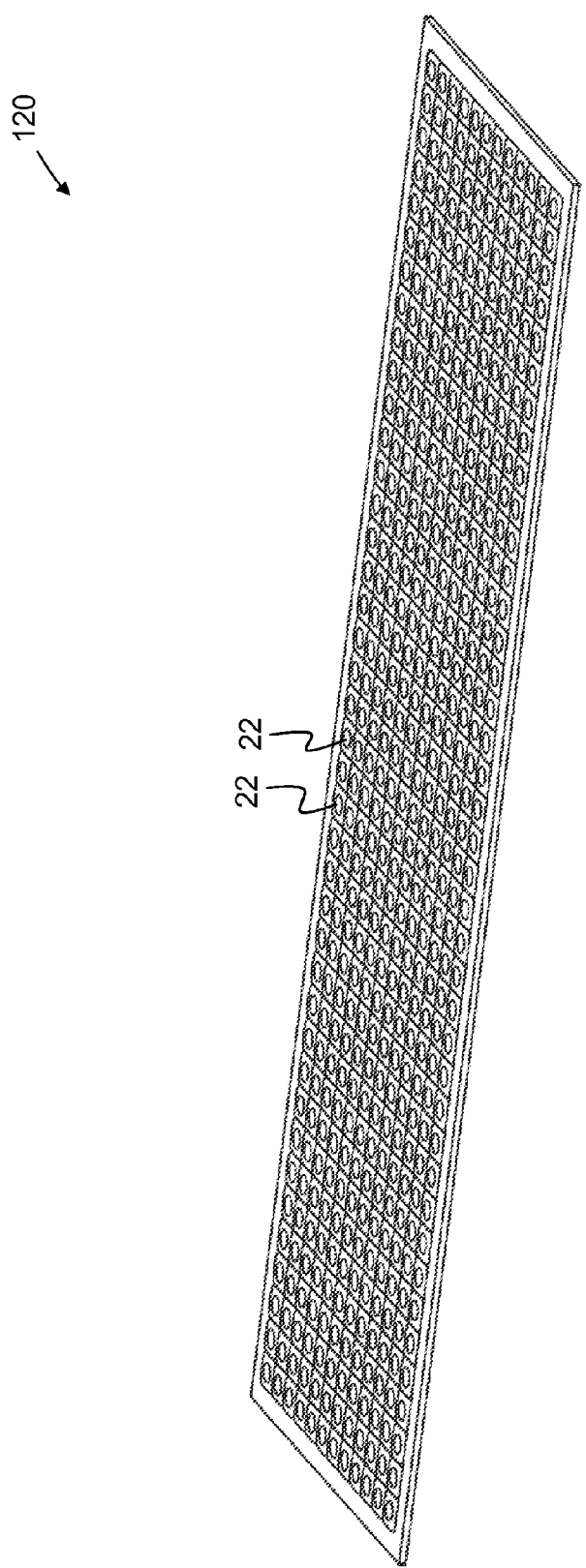
FIG. 11 is a perspective view of another embodiment of a concentrated photovoltaic panel.

Other configurations are possible. For example, although in the embodiment described above, the panel comprises sixteen (16) concentrated photovoltaic collectors arranged in a four-by-four (4×4) array, in other embodiments the panel may alternatively comprise fewer or more concentrated photovoltaic collectors. For example, FIG. 11 shows another embodiment of a concentrated photovoltaic panel, which is generally indicated by reference numeral 120. The panel 120 is generally similar to panel 20 described above, and comprises a plurality of first optical elements 22, a first compliant layer 24, a first rigid sheet 26, a conductor grid 28, one or more photovoltaic elements 30, an intermediate layer 32, a second rigid sheet 34, a second compliant layer 36, and a plurality of second optical elements 38, all of which are arranged in a generally stacked manner. The panel 120 comprises four-hundred and eighty (480) concentrated photovoltaic collectors arranged in a twelve-by-forty (12×40) array.

In still other embodiments, the panel may alternatively comprise only one (1) concentrated photovoltaic collector.

Any of the panels described herein can be made to the same or generally similar dimensions of a conventional, non-concentrated photovoltaic panel, such that the panel and the convention panel can be mounted together on a conventional photovoltaic tracking system or mount.

Figure 12:
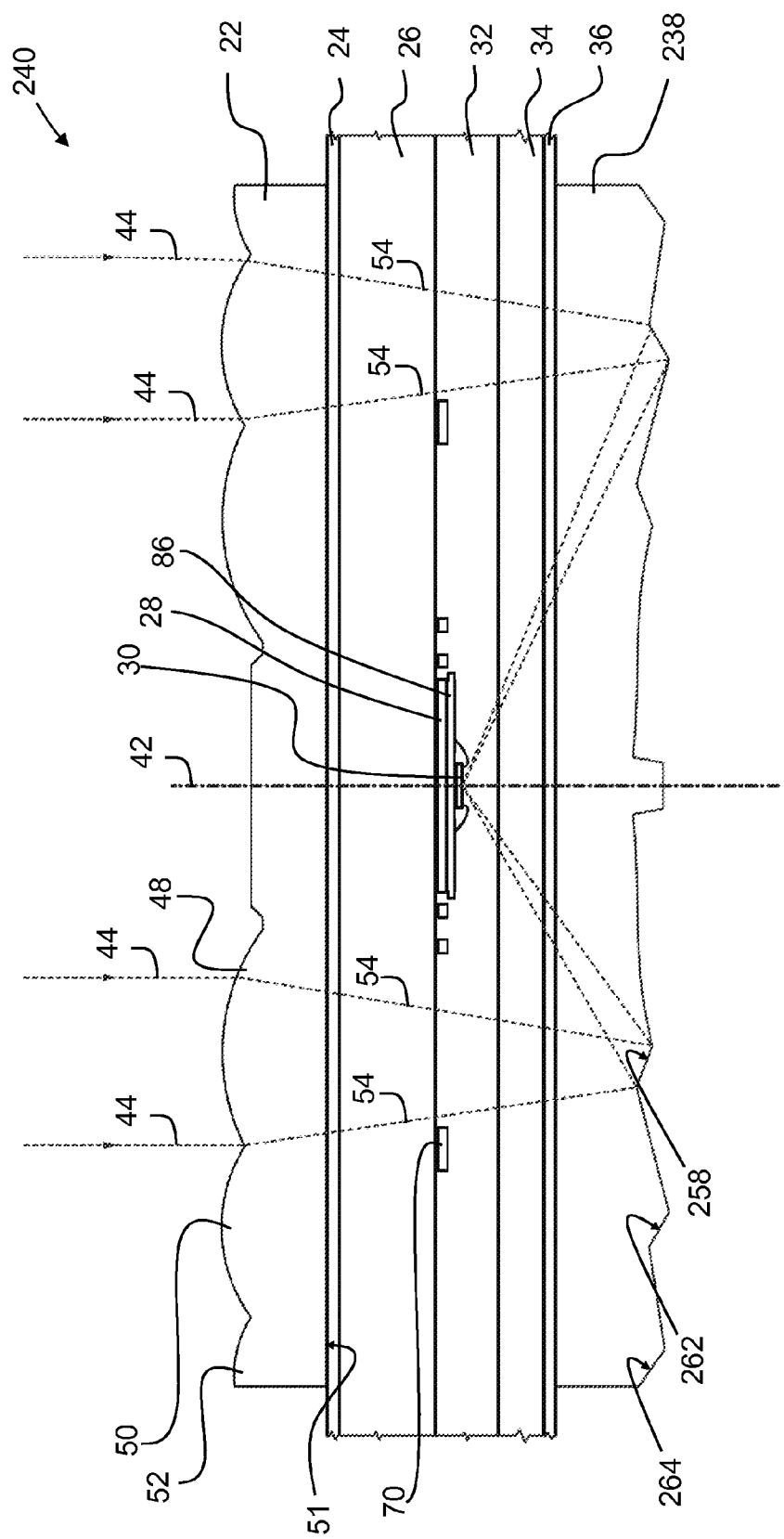
FIG. 12 is an enlarged fragmentary view of a portion of still another embodiment of a concentrated photovoltaic panel, showing light rays.

The first optical element and the second optical element are not limited to the configurations described above, and in other embodiments, the first optical element and/or the second optical element may alternatively have a different configuration. For example, FIG. 12 shows a concentrated photovoltaic collector forming part of another embodiment of a concentrated photovoltaic panel, and which is generally indicated by reference numeral 240. The collector 240 is generally similar to the collector 40 of panel 20 described above, and comprises the first optical element 22, the first compliant layer 24, the first rigid sheet 26, the conductor grid 28, the photovoltaic element 30, the intermediate layer 32, the second rigid sheet 34, the second compliant layer 36, and further comprises a second optical element 238, all of which are arranged in a generally stacked manner. The second optical element 238 is configured to cooperate with the first optical element 22 for reflecting direct light to the photovoltaic element 30. The second optical element 238 is fabricated of a light-transmissive material, and in this embodiment the second optical element 238 is fabricated of PMMA. The second optical element 238 is shaped so as to comprise a plurality of annular reflecting surfaces that are arranged in a concentric manner about a central axis. The second optical element 238 is positioned relative to the first optical element 22 within the collector 240 such that its central axis coincides with the normal axis 42. The annular reflecting surfaces are configured to reflect direct light 54 focused by the first optical element 22 to the photovoltaic element 30. In the embodiment shown, the second optical element 238 comprises three (3) annular reflecting surfaces, namely a first reflecting surface 258 configured to reflect direct light 54 focused by the first lens 48 to the photovoltaic element 30, a second reflecting surface 262 configured to reflect direct light 54 focused by the second lens 50 to the photovoltaic element 30, and a third reflecting surface 264 configured to reflect direct light 54 focused by the third lens 52 to the photovoltaic element 30. As will be understood, in this manner, the second optical element 238 reflects direct light focused by the first optical element 22 by total internal reflection (TIR).

In another embodiment, the reflecting surfaces 264 may alternatively include a mirror coating.

Figure 13:
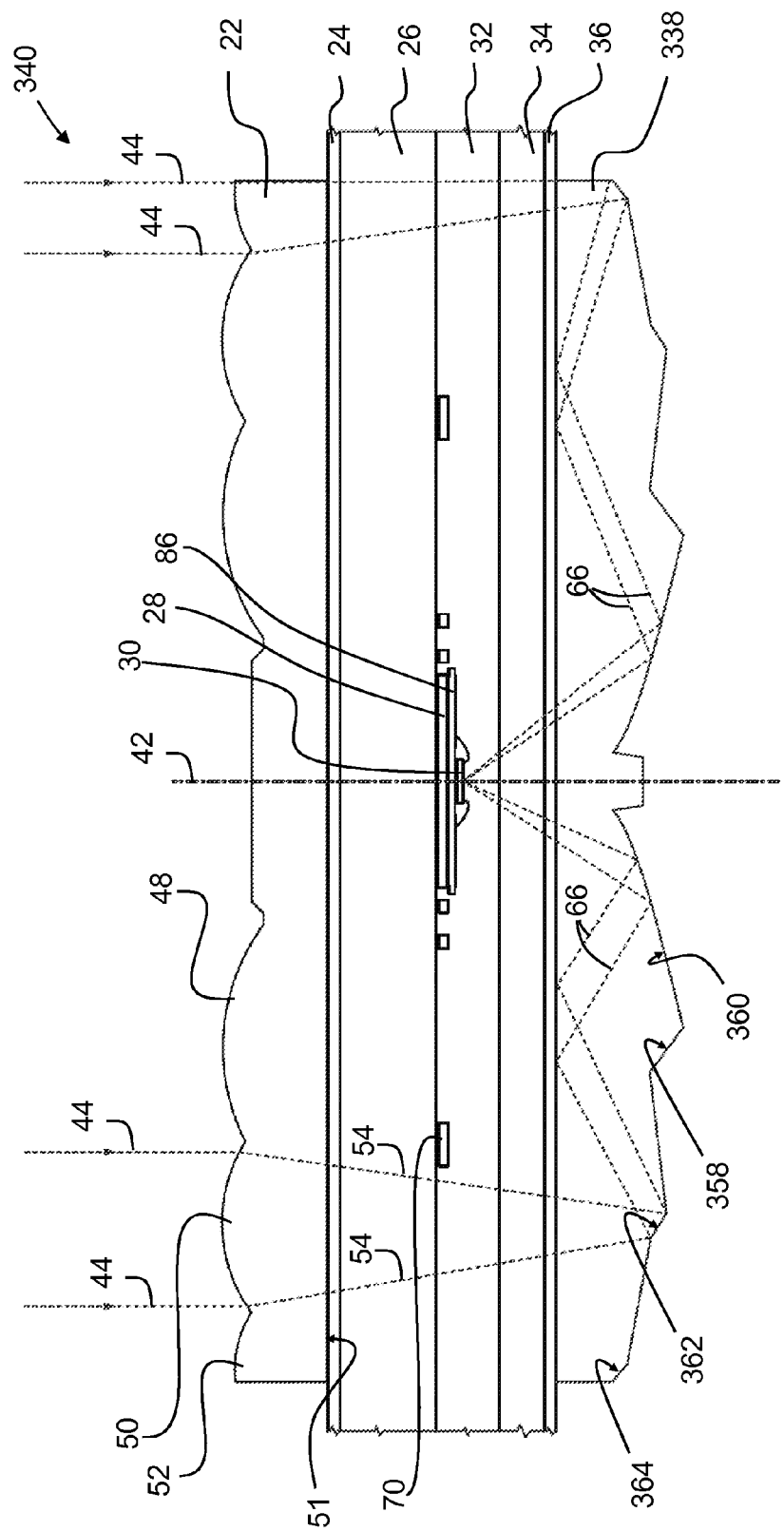
FIG. 13 is an enlarged fragmentary view of a portion of yet another embodiment of a concentrated photovoltaic panel, showing light rays.

FIG. 13 shows another embodiment of a concentrated photovoltaic collector forming part of another embodiment of a concentrated photovoltaic panel, and which is generally indicated by reference numeral 340. The collector 340 is generally similar to the collector 40 of panel 20 described above, and comprises the first optical element 22, the first compliant layer 24, the first rigid sheet 26, the conductor grid 28, the photovoltaic element 30, the intermediate layer 32, the second rigid sheet 34, the second compliant layer 36, and further comprises a second optical element 338, all of which are arranged in a generally stacked manner. The second optical element 238 is configured to cooperate with the first optical element 22 for reflecting direct light to the photovoltaic element 30. The second optical element 338 is fabricated of a light-transmissive material, and in this embodiment the second optical element 338 is fabricated of PMMA. The second optical element 338 is shaped so as to comprise a plurality of annular reflecting surfaces that are arranged in a concentric manner about a central axis. The second optical element 338 is positioned relative to the first optical element 22 within the collector 340 such that its central axis coincides with the normal axis 42. The annular reflecting surfaces are configured to reflect direct light 54 focused by the first optical element 22 to the photovoltaic element 30. In the embodiment shown, the second optical element 338 comprises four (4) annular reflecting surfaces, namely a first reflecting surface 358 configured to reflect direct light 54 focused by the first lens 48 to an inner reflecting surface 360 via reflection by the second compliant layer 36, a second reflecting surface 362 configured to reflect direct light 54 focused by the second lens 50 to the inner reflecting surface 360 via reflection by the second compliant layer 36, and a third reflecting surface 364 configured to reflect direct light 54 focused by the third lens 52 to the inner reflecting surface 360 via reflection by the second compliant layer 36. The inner reflecting surface 360, in turn, is configured to reflect direct light 66 reflected by the first, second and third reflecting surfaces 358, 362 and 364 via reflection by the second compliant layer 36 to the photovoltaic element 30. As will be understood, in order for light to be reflected by the second compliant layer 36, the second optical element 338 must have an index of refraction that is higher than that of the second compliant layer 36. In this manner, the second optical element 338 reflects direct light focused by the first optical element 22 by total internal reflection (TIR).

Figure 14:
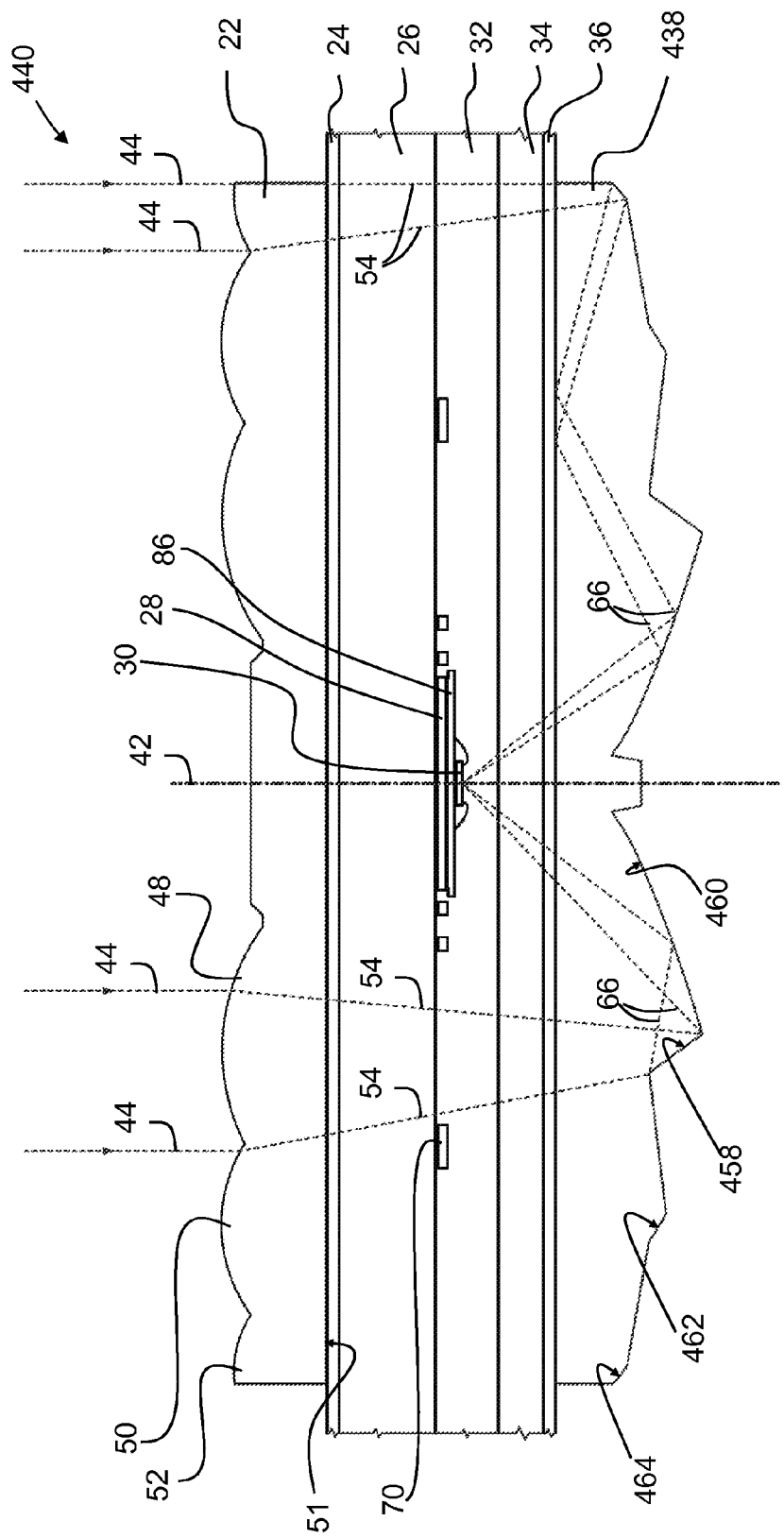
FIG. 14 is an enlarged fragmentary view of a portion of still yet another embodiment of a concentrated photovoltaic panel, showing light rays.

FIG. 14 shows another embodiment of a concentrated photovoltaic collector forming part of another embodiment of a concentrated photovoltaic panel, and which is generally indicated by reference numeral 440. The collector 440 is generally similar to the collector 40 of panel 20 described above, and comprises the first optical element 22, the first compliant layer 24, the first rigid sheet 26, the conductor grid 28, the photovoltaic element 30, the intermediate layer 32, the second rigid sheet 34, the second compliant layer 36, and further comprises a second optical element 438, all of which are arranged in a generally stacked manner. The second optical element 438 is configured to cooperate with the first optical element 22 for reflecting direct light to the photovoltaic element 30. The second optical element 438 is fabricated of a light-transmissive material, and in this embodiment the second optical element 438 is fabricated of PMMA. The second optical element 338 is shaped so as to comprise a plurality of annular reflecting surfaces that are arranged in a concentric manner about a central axis. The second optical element 438 is positioned relative to the first optical element 22 within the collector 440 such that its central axis coincides with the normal axis 42. The annular reflecting surfaces are configured to reflect direct light 54 focused by the first optical element 22 to the photovoltaic element 30. In the embodiment shown, the second optical element 438 comprises four (4) annular reflecting surfaces, namely a first reflecting surface 458 configured to reflect direct light 54 focused by the first lens 48 to an inner reflecting surface 460, a second reflecting surface 462 configured to reflect direct light 54 focused by the second lens 50 to the inner reflecting surface 460 via reflection by the second compliant layer 36, and a third reflecting surface 464 configured to reflect direct light 54 focused by the third lens 52 to the inner reflecting surface 460 via reflection by the second compliant layer 36. The inner reflecting surface 460, in turn, is configured to reflect direct light 66 reflected by the first, second and third reflecting surfaces 458, 462 and 464, and if applicable via reflection by the second compliant layer 36, to the photovoltaic element 30. As will be understood, in this manner, the second optical element 438 reflects direct light focused by the first optical element 22 by total internal reflection (TIR).

Although in the embodiment described above, the first optical element comprises three (3) lenses, in other embodiments, the first optical element may alternatively comprise fewer or more lenses.

Although in the embodiment described above, the first optical element is shaped so as to comprise a plurality of generally ring-shaped lenses that are arranged in a concentric manner, in other embodiments, the lenses of the first optical element may alternatively have a different shape and/or configuration.

Although in the embodiment described above, the second optical element comprises three (3) annular reflecting surfaces, in other embodiments, the second optical element may alternatively comprise fewer or more annular reflecting surfaces.

Although in the embodiment described above, the second optical element is shaped so as to comprise a plurality of annular reflecting surfaces that are arranged in a concentric manner, in other embodiments, the reflecting surfaces of the second optical element may alternatively have a different shape and/or configuration. For example, in one such embodiment, the reflecting surfaces may alternatively be planar surfaces arranged in one or more ring-shaped patterns.

Although in the embodiment described above, the first and second rigid sheets are fabricated of glass, in other embodiments, the first and second rigid sheets may alternatively be fabricated of other suitable light-transmissive materials. For example, in other embodiments, the first and second sheets may alternatively be fabricated of rigid, injection molded PMMA, polymethyl methacrylimide (PMMI), polycarbonates, cyclo olefin polymers (COP), cyclo olefin copolymers (COC), polytetrafluoroethylene (PTFE), or a combination thereof.

Although in the embodiment described above, the first optical element and the second optical element are fabricated of injection molded PMMA, in other embodiments, one or both of the first optical element and the second optical element may alternatively be fabricated of another suitable light-transmissive material. For example, in other embodiments, one or both of the first optical element and the second optical element may alternatively be fabricated of light-transmissive polymeric materials such as glass, or rigid, injection molded polymethyl methacrylimide (PMMI), polycarbonates, cyclo olefin polymers (COP), cyclo olefin copolymers (COC), polytetrafluoroethylene (PTFE), or a combination thereof, or a silicone rubber such as silicone having hardness, when cured, of at least 20 Shore A.

Although in the embodiment described above, the first and second compliant layers are fabricated of silicone, in other embodiments, one or both of the first and second compliant layers may alternatively be fabricated of one or more other suitable elastomeric material. For example, in other embodiments, the first and second compliant layers may alternatively be fabricated of ethylene-vinyl acetate or an ionomer.

Although in the embodiment described above, the conductor grid is fabricated of copper, in other embodiments, the conductor grid may alternatively be fabricated of any material that is suitably electrically conductive and suitably thermally conductive. For example, and without being limited thereto, in other embodiments the conductor grid may alternatively be fabricated of another conductive metal such as gold, silver or aluminum, a conductive metal alloy, a polymer loaded with a conductive metal or conductive metal alloy, and the like.

Although in the embodiment described above, the conductor grid is stamped copper foil that is bonded to the first rigid sheet by adhesive, in other embodiments, other configurations may be used. For example, in other embodiments, the conductor grid may alternatively be applied to a surface of the rigid sheet by any suitable metallization process, which could, for example, include sputtering, galvanizing or screen printing a thick film. In other embodiments, conductors such as wires, ribbons and/or foils, may alternatively be attached to the rigid sheet by soldering the conductors to metallizations on the rigid sheet (e.g., metallized dots).

Although in the embodiments described above, the panel comprises a first rigid sheet and a second rigid sheet, in other embodiments, the panel may alternatively comprise only a single rigid sheet. For example, in one such embodiment, the panel may alternatively comprise one or more first optical elements, an elastomeric compliant layer, a single rigid sheet, a conductor grid, one or more photovoltaic elements, an intermediate layer, and one or more second optical elements, all of which are arranged in a generally stacked manner, and with the one or more second optical elements being generally disposed on, and attached to, the intermediate layer. Other configurations comprising a single rigid sheet are possible, with the one or more first optical elements being disposed adjacent a first side of the single rigid sheet, and with the one or more second optical elements being disposed adjacent a second side of the at least one rigid sheet.

In other embodiments, each receiver may alternatively include a bypass diode to improve the performance of the panel in the event of shading of one or more photovoltaic elements, or when differences in optical efficiency exist between photovoltaic elements.

Although embodiments have been described above with reference to the accompanying drawings, those of skill in the art will appreciate that variations and modifications may be made without departing from the scope thereof as defined by the appended claims.

What is claimed is:

1. A concentrated photovoltaic panel comprising:
   at least one rigid sheet;
   one or more first optical elements disposed adjacent a first side of the at least one rigid sheet, each of the first optical elements comprising at least one lens;
   one or more second optical elements disposed adjacent a second side of the at least one rigid sheet, each of the second optical elements comprising at least one reflecting surface; and
   one or more photovoltaic elements, each photovoltaic element disposed between a respective first optical element and a respective second optical element, wherein the at least one lens of the first optical element is configured to focus light impinging thereon at an angle normal to a plane defined by the rigid sheet onto a corresponding reflecting surface of the respective second optical element, the second optical element being configured to reflect light focused by the first optical element to the photovoltaic element, each reflecting surface being configured to reflect light by total internal reflection,
   wherein diffuse light impinging on the one or more first optical elements is transmitted to the exterior of the concentrated photovoltaic panel through the one or more second optical elements.

2. The panel of claim 1, wherein the at least one lens comprises a generally ring-shaped, plano-convex lens arranged concentrically about a central axis of the first optical element.

3. The panel of claim 2, wherein the lens comprises a convex surface defined as a surface of full revolution around the central axis.

4. The panel of claim 3, wherein the convex surface is spaced radially from the central axis.

5. The panel of claim 2, wherein the lens comprises a planar surface that is co-planar with a planar back surface of the first optical element.

6. The panel of claim 5, wherein the planar back surface is oriented towards and generally parallel with the at least one rigid sheet.

7. The panel of claim 1, wherein the at least one reflecting surface comprises an annular reflecting surface arranged concentrically about a central axis of the second optical element.

8. The panel of claim 7, wherein the annular reflecting surface is defined as a surface of revolution around the central axis.

9. The panel of claim 7, wherein each second optical element further comprises an inner reflecting surface configured to reflect light reflected by the annular reflecting surface to the photovoltaic element.

10. The panel of claim 9, wherein the inner annular reflecting surface is defined as a surface of revolution around the central axis.

11. The panel of claim 7, wherein each second optical element is positioned such that the central axis is generally collinear with a central axis of the respective first optical element.

12. The panel of claim 11, wherein each photovoltaic element is positioned on the generally collinear central axes.

13. The panel of claim 1, further comprising a compliant layer disposed between the at least one rigid sheet and at least one of the first optical element and the second optical element.

14. The panel of claim 1, wherein the at least one rigid sheet comprises a first rigid sheet spaced from and parallel with a second rigid sheet, the one or more photovoltaic elements being disposed between the first and second rigid sheets.

15. The panel of claim 1, further comprising structure configured to conduct heat away from the photovoltaic element.

16. The panel of claim 15, wherein the structure is a conductor grid providing an electrical connection to the photovoltaic element.

17. The panel of claim 15, wherein the structure comprises a plurality of strips extending radially outwardly from the photovoltaic element.

18. The panel of claim 17, wherein the structure further comprises a first arc and a second arc attached to the strips.

* * * * *